(12) United States Patent
Kowalski et al.

(10) Patent No.: US 7,928,021 B2
(45) Date of Patent: Apr. 19, 2011

(54) SYSTEM FOR AND METHOD OF MICROWAVE ANNEALING SEMICONDUCTOR MATERIAL

(75) Inventors: Jeffrey Michael Kowalski, Aptos, CA (US); Jeffrey Edward Kowalski, San Jose, CA (US)

(73) Assignee: DSGI, Inc., Morgan Hill, CA (US)

( * ) Notice: Subject to any disclaimer, the term of this patent is extended or adjusted under 35 U.S.C. 154(b) by 205 days.

(21) Appl. No.: 12/212,617

(22) Filed: Sep. 17, 2008

(65) Prior Publication Data
US 2009/0184399 A1    Jul. 23, 2009

Related U.S. Application Data
(60) Provisional application No. 60/972,898, filed on Sep. 17, 2007.

(51) Int. Cl.
*H01L 21/268* (2006.01)
*H01L 21/42* (2006.01)
*H01L 21/428* (2006.01)

(52) U.S. Cl. ........ 438/795; 438/663; 438/660; 438/659; 257/E21.471; 257/E21.001; 257/E21.328

(58) Field of Classification Search .......... 438/795, 438/663, 660, 659; 257/E21.471, E21.001, 257/E21.328
See application file for complete search history.

(56) References Cited

U.S. PATENT DOCUMENTS

| | | | |
|---|---|---|---|
| 4,774,992 A | 10/1988 | George | |
| 5,808,282 A * | 9/1998 | Apte et al. | 219/679 |
| 5,820,261 A | 10/1998 | Yam | |
| 6,051,483 A * | 4/2000 | Lee et al. | 438/530 |
| 7,589,028 B1 * | 9/2009 | Cho et al. | 438/778 |
| 2004/0040632 A1 * | 3/2004 | Oosterlaken | 148/527 |
| 2007/0167029 A1 | 7/2007 | Kowalski | |

* cited by examiner

*Primary Examiner* — Ngan Ngo
*Assistant Examiner* — Benjamin Tzu-Hung Liu
(74) *Attorney, Agent, or Firm* — Hovey Williams LLP

(57) ABSTRACT

A system for and method of processing, i.e., annealing semiconductor materials. By controlling the time, frequency, variance of frequency, microwave power density, wafer boundary conditions, ambient conditions, and temperatures (including ramp rates), it is possible to repair localized damage lattices of the crystalline structure of a semiconductor material that may occur during the ion implantation of impurities into the material, electrically activate the implanted dopant, and substantially minimize further diffusion of the dopant into the silicon. The wafer boundary conditions may be controlled by utilizing susceptor plates (4) or a water chill plate (12). Ambient conditions may be controlled by gas injection (10) within the microwave chamber (3).

13 Claims, 5 Drawing Sheets

SYSTEM FOR AND METHOD OF MICROWAVE ANNEALING SEMICONDUCTOR MATERIAL

RELATED APPLICATIONS

The present non-provisional patent application is related to and claims priority benefit of an earlier-filed non-provisional patent application having the title, THERMAL PROCESSING SYSTEM, COMPONENTS, AND METHODS, application Ser. No. 11/559,315, filed Nov. 13, 2006 and an earlier-filed provisional patent application having the title, SYSTEM FOR AND METHOD OF MICROWAVE ANNEALING SEMICONDUCTOR MATERIAL, Ser. No. 60/972,898, filed Sep. 17, 2007. The identified earlier-filed applications are hereby fully incorporated by reference into the present application.

FIELD OF THE INVENTION

The present invention relates broadly to systems for and methods of processing, i.e., annealing, semiconductor materials. More specifically, the present invention concerns a system for and method of using microwave radiation to activate dopants and to repair damage to the crystalline structure of a semiconductor material that may occur during the ion-implantation of impurities into the material.

BACKGROUND OF THE INVENTION

Advances in the miniaturization of semiconductor devices lead to better-performance and increased storage capacity for end-users. Many process steps are involved in the manufacturing of the semiconductor device. One step is the doping of semiconductor substrate to form source/drain junctions. Ion-implantation is used to modify the electrical characteristics of the semiconductor substrate by the implantation of specific dopant impurities into the semiconductor wafer surface. The dopants that are commonly used are Boron, Arsenic and Phosphorus; other dopants can be used as well and are always being investigated. With the use of ion-implantation a post annealing treatment is desired to complete the activation process as well as repair any associated damage to the implanted region. Post anneal treatments can differ based on the implant dosage (the amount of atoms implanted in the surface) and the implant energy (the depth of atoms into the wafer surface). Implants that are greater than approximately ~5 keV and dosages greater than approximately 4E15 atoms/cm3 form an amorphous layer that is re-grown using the post anneal process and are subject to end of range (EOR) defects, or un-repaired damage. Implants less than approximately 5 keV do not form an amorphous layer and are considered Ultra Shallow Junction (USJ) implants, which also utilize a post anneal process to electrically activate the dopants. Unfortunately, the post-implantation anneal becomes more challenging due to the limitations of dopant diffusion, the damage recovery percentage, and the thermal budget for the next generation of semiconductor devices. The development of post annealing processing equipment able to meet operational requirements has been difficult.

Annealing techniques have included furnace processing, Rapid Thermal Processing (RTP), Rapid Thermal Annealing (RTA), which includes Flash Annealing, and various versions of Laser Annealing. Unfortunately, each of these methods are associated with certain problems and disadvantages. For example, Rapid Thermal Processing is a high-temperature process, i.e., 800 degrees C. to 1100 degrees C., which can cause degradation to the performance of the semiconductor material, as well as an undesired diffusion of the dopant into the surrounding material. Similarly, Laser Annealing methods are hampered by process integration issues mainly due to the "pattern effects" of the layers. For example in the laser anneal process, a laser is used with a spot size diameter of approximately 3 mm. Although, the area within the spot size is activated, it is much smaller than the total area needed to be activated on the wafer surface. So the laser is used many times and moved each time to cover the entire implanted area. As a result, there is overlapping and/or missed areas forming a "pattern". In terms of manufacturing requirements, laser annealing is typically a slower process of approximately one wafer per hour, whereby approximately twenty wafers per hour is commercially desired.

There are also annealing techniques using microwave energy, see, e.g., U.S. Pat. No. 4,303,455. In this context, the term "microwave" is often used rather loosely to refer to electromagnetic radiation in the millimeter, microwave, and radio-frequency spectrums. Microwave annealing more evenly heats the entire volume from the inside outward (as opposed to from the surface inward) of the semiconductor material. The volumetric absorption of microwave heating in dielectric lossy materials has been used in a number of different applications, including in the thermal processing of ceramic materials; however, the application to semiconductor materials is rather new and limited. Experiments using magnetron and gyrotron sources in combination with multi-mode processing chambers have been attempted. Heating rates of approximately 100 degrees C./sec and processing temperatures of approximately 1000 degrees C. over a few seconds were achieved, yet demonstrated no improvement over the RTP techniques. Largely due to the use of fast ramp rates and high microwave power fields, the temperature of the wafer exceeded 800 degrees C., resulting in the thermal radiation within the wafer becoming dominate, thereby minimizing any advantage associated with microwave heating.

In methods currently used, heating times must be severely minimized to limit the increase of the thermal budget (the total amount of thermal energy transferred to the wafer during the given elevated temperature operation) because higher temperatures are used in the annealing process.

Due to these and other problems and disadvantages in the prior art, a need exists for an improved system for and method of annealing semiconductor materials.

SUMMARY OF THE INVENTION

The present invention overcomes the above-discussed and other problems and disadvantages by providing a system for and method of annealing using microwave energy to react with the damaged crystalline lattice structure of the semiconductor material and, in doing so, facilitate its repair, i.e., its return to the desired structure.

The present invention allows the thermal budget to stay within a desired range to prevent dopant diffusion, in spite of the longer heating times.

In one embodiment, multiple sources of microwave radiation may be used. In this embodiment, up to approximately ten individual sources are used to provide the microwave treatment. At least one of the microwave sources, in one embodiment, may be a magnetron source.

A susceptor plate is used, in one embodiment, to create a substantially uniform microwave energy field for the wafer and to maintain the desired temperature level. The susceptor plate is positioned, in one embodiment, below the semiconductor wafer. In another embodiment, a susceptor plate is positioned both above and below the semiconductor wafer; that is, on opposite sides of the semiconductor. In either embodiment, the susceptor plate may be made of silicon, silicon carbide, fused quartz, or any other suitable material. In yet another embodiment, a water chill plate may be added below and in contact with the susceptor plate.

The susceptors are, in one embodiment, approximately 1 mm thick to approximately 6 mm thick and have an outside diameter which is at least slightly, e.g., approximately 6 mm larger than that of the process wafer, but are not limited to the same size of the semiconductor wafer. Susceptors may be a variety of sizes and shapes, rather than a simple disc. For example, in one embodiment, the susceptor is a disc with a cut out profile (e.g. donut shape).

A temperature sensing device may be used to monitor the temperature of the wafer within the chamber and maintain the temperature at or below a desired temperature. In one embodiment, the temperature sensing includes an infra-red pyrometer or other non-contact temperature sensing method.

The present invention, in one embodiment, accommodates multiple wafers, i.e. batch processing. Although such an implementation typically utilizes multiple microwave power sources, batch processing allows for increased wafer throughput and can thereby lower the processing cost per wafer. The present invention is capable of simultaneously processing multiple wafers.

In another embodiment, the system combines one or more treatments in series. In one embodiment, the first treatment is processed at approximately 500 degrees C. for approximately 300 seconds and the second treatment is processed at about 800 degrees C. for approximately 100 seconds. In this embodiment, the damage recovery percentage increases over a single treatment. Although the second treatment may be at a temperature higher or lower than 800 degrees C., by undergoing the first treatment prior to the second treatment, the dopant diffusion, which is typically a problem when undergoing a single treatment at a temperature of 800 degrees C., is minimal.

The frequency is controlled to ensure formation of proper mode patterns in order to create a uniform microwave field. In one embodiment, an acceptable range of frequencies is 900 MHz to 150 GHz. Once a center frequency is selected within this range (e.g. 5800 MHz) then the frequency is varied within 50 MHz. (note: the varying of frequency within the range of approximately 30 MHz to 50 MHz using a magnetron source). In another embodiment, two separate center frequencies can be chosen (e.g. 2450 MHz and 5800 MHz) and run at the same time within the same process chamber. In yet another embodiment, a center frequency is chosen at 5000 MHz and varied over a larger range greater than 50 MHz. In one embodiment, an acceptable frequency is 5800 MHz. In each of the above embodiments corresponding to a frequency or range of frequencies, the use of multiple magnetrons are used set at different frequencies and vary by approximately 50 MHz. Other microwave sources (e.g. gyrotron, twta) may be used to accomplish this technique as well.

These and other features of the present invention are described in greater detail below in the section titled DETAILED DESCRIPTION.

BRIEF DESCRIPTION OF THE DRAWING FIGURES

The present invention is described herein with reference to the following drawing figures, with greater emphasis being placed on clarity rather than scale:

DETAILED DESCRIPTION OF THE INVENTION

Figure 1:
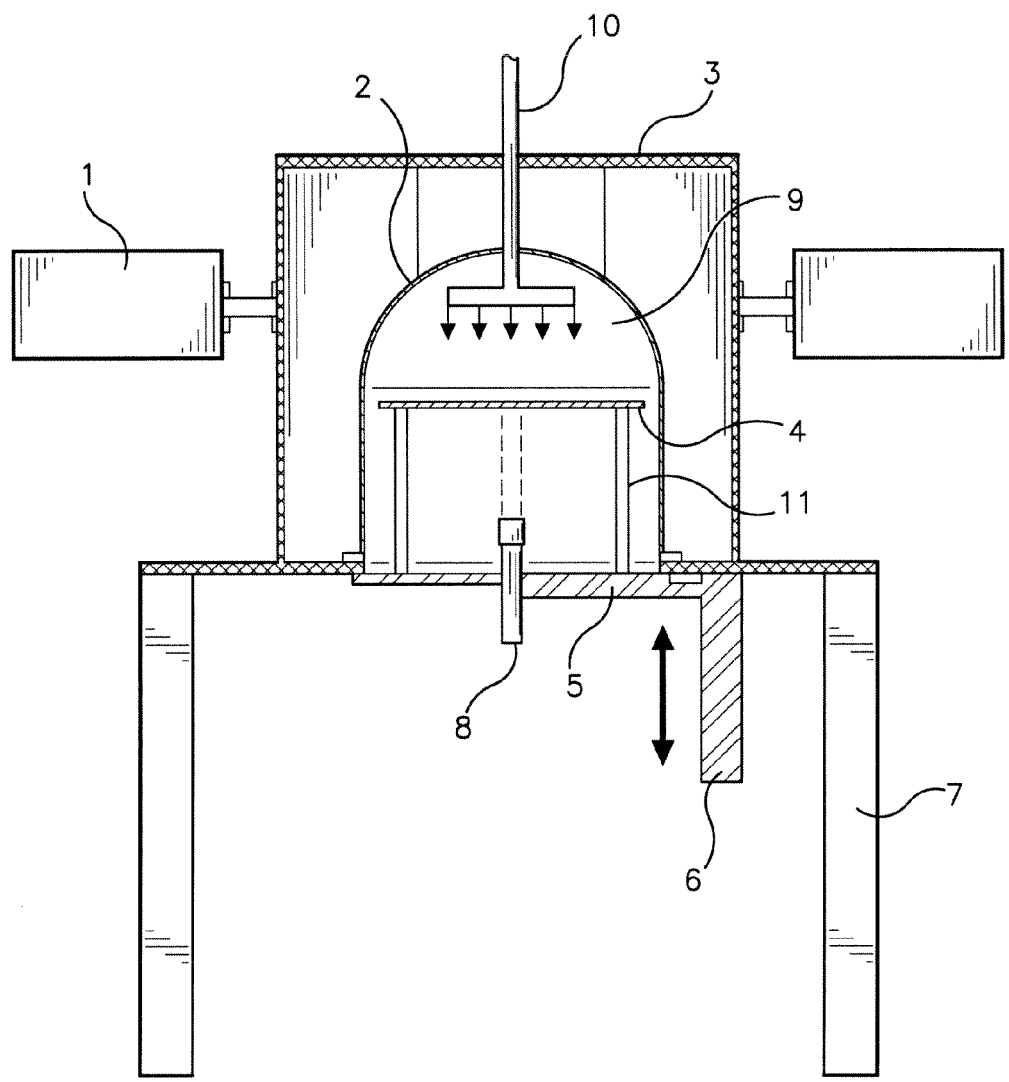
FIG. 1 is a cross section view of one embodiment of the system.

With reference to the drawing figures, a system and method are herein described, shown, and otherwise disclosed in accordance with various embodiments, including one or more preferred embodiments, of the present invention.

Broadly, referring to FIG. 1, the present invention concerns an apparatus for and method of utilizing microwave energy for annealing and activating of ion implanted wafers. By controlling the time, microwave power density, wafer boundary conditions, ambient conditions, and temperatures (including ramp rates), it is possible to repair localized damage lattices of the crystalline structure of a semiconductor material that may occur during the ion implantation of impurities into the material, electrically activate the implanted dopant, and substantially minimize further diffusion of the dopant into the silicon. It is also possible to adjust the conditions to control the dopant profile activation percentage in the silicon and damage recovery with the configuration of the microwave power density and the susceptors.

More particularly, the present invention concerns a method of lowering the activation and damage repair temperatures in sharp contrast to those used in other methods. Previously, temperatures typically exceeding 800 degrees C. were used in one particular example of standard prior art treatment with a process time of approximately 100 seconds. The present invention achieves the same activation and damage repair results at a lower temperature of about 500 degrees C. and a process time of approximately 300 seconds. The lower process temperatures achieved with the present invention allow chip manufacturers to use materials such as metals (Al, Ni) in the semiconductor devices that may increase performance and were previously impossible to use due to the activation temperature being above 800 degrees C., which damages the metals lines. Activation temperatures below 500 degrees C. do not cause such damage.

Figure 4:
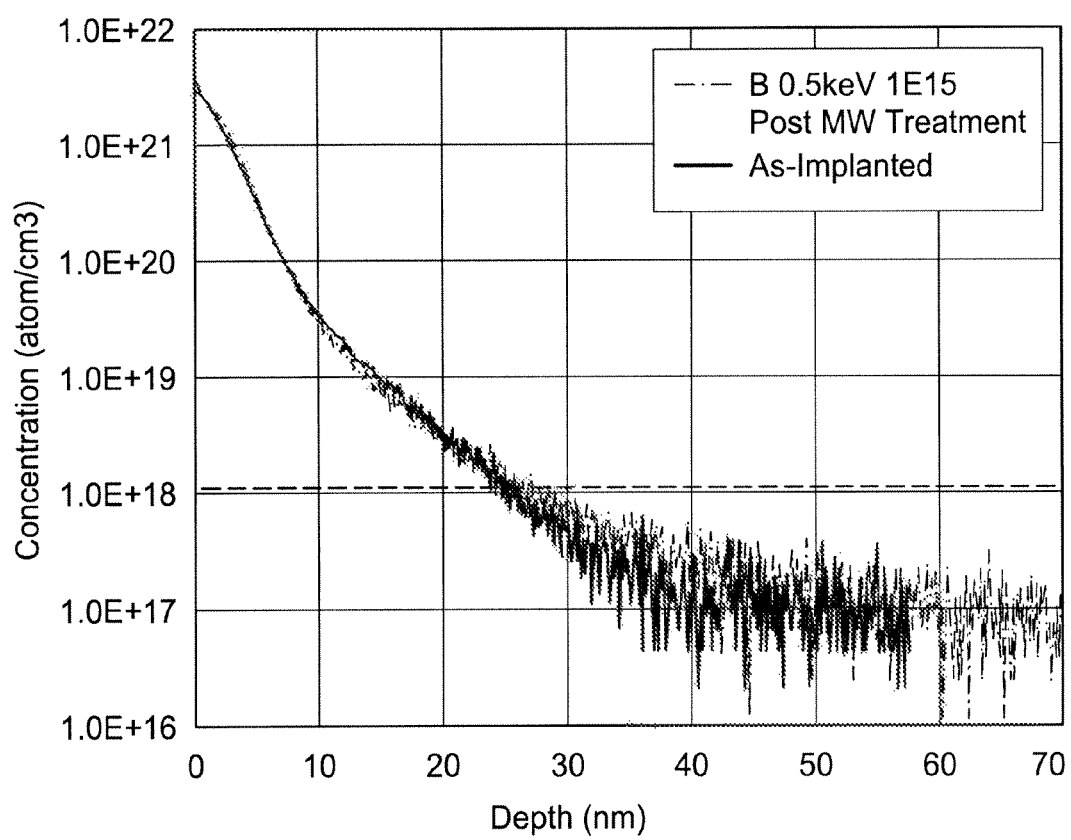
FIG. 4 is a SIMS profile graph of an Ultra Shallow Junction (USJ) implant, pre- and post-microwave treatment, showing the effect of no dopant diffusion of the implanted region.
Figure 5:
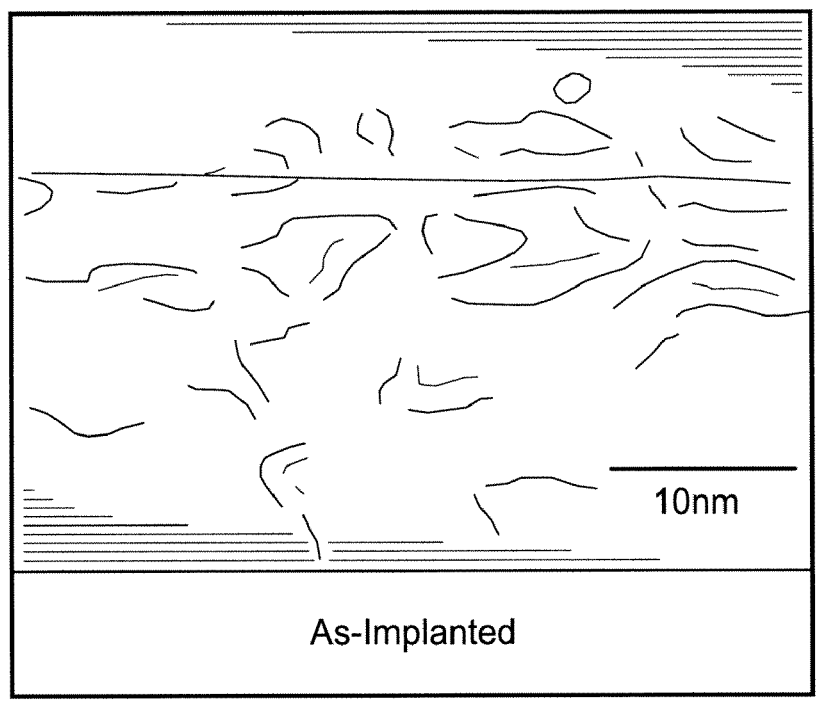
FIG. 5 is a view of Transmission Electron Microscopy (TEM), demonstrating the damage recovery of the present invention treatment, pre-process.
Figure 6:
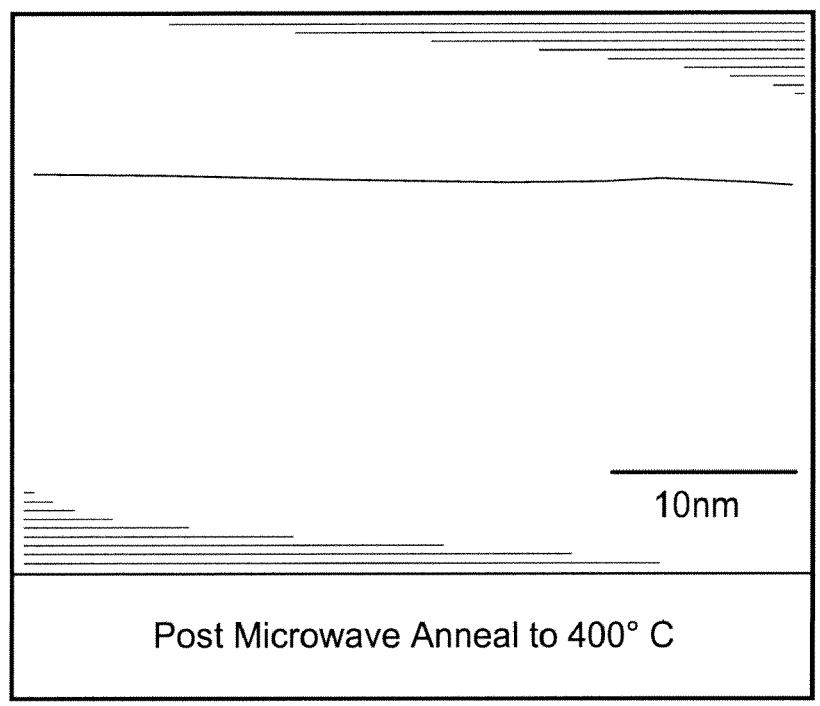
FIG. 6 is a view of Transmission Electron Microscopy (TEM), demonstrating the damage recovery of the present invention treatment, post-process.

Another more particular aspect of the present invention is a method of minimizing the dopant diffusion into the silicon. An Ultra Shallow Junction (USJ) implant is a method used by chip manufactures in shrinking the device geometry desires little to no diffusion of the implanted region in post treatments to avoid degradation of the junction performance. Methods that heat a wafer above 800 degrees C. have an adverse thermal effect on dopant implants (such as Boron which is a highly mobile atom) and diffuse the dopant into the semiconductor wafer. The present invention keeps wafer temperatures low, allowing little to no dopant diffusion into the silicon (FIG. 4. shows substantially no diffusion of an USJ implant) while still maintaining comparable activation results to due to the unique and efficient microwave interaction method of the present invention. This allows device manufacturers enhanced performance of these junctions for the next generation smaller geometry devices.

Another more particular aspect of the present invention is the use of two of the present invention treatments in series. The first treatment is processed at between approximately 100 and 800 degrees C. at approximately between 100 and 300 seconds achieving a particular activation percentage and a particular damage recovery percentage. In various embodiments, the temperature and time are approximately 100 degrees C., 800 degrees C., 100 seconds, and 300 seconds. The semiconductor wafer can then be subjected to a second treatment, this time at a higher temperature of about 800 degrees C. for about 100 seconds to further repair the damage of the implanted region. (The first treatment is required to limit the diffusion of the second treatment at higher temperatures). Using this method will have an overall higher damage recovery percentage as compared to one treatment at 800 degrees C. for 100 seconds. The second treatment is not limited to a temperature of 800 degrees C. and can be lower or much higher in temperature. This method is used to achieve damage recovery percentages equal to high temperature (>1000 degrees C.) with minimal dopant diffusion in comparison. This method is most beneficial to the use of pre-amorphous implants (PAI).

General Operation

Figure 2:
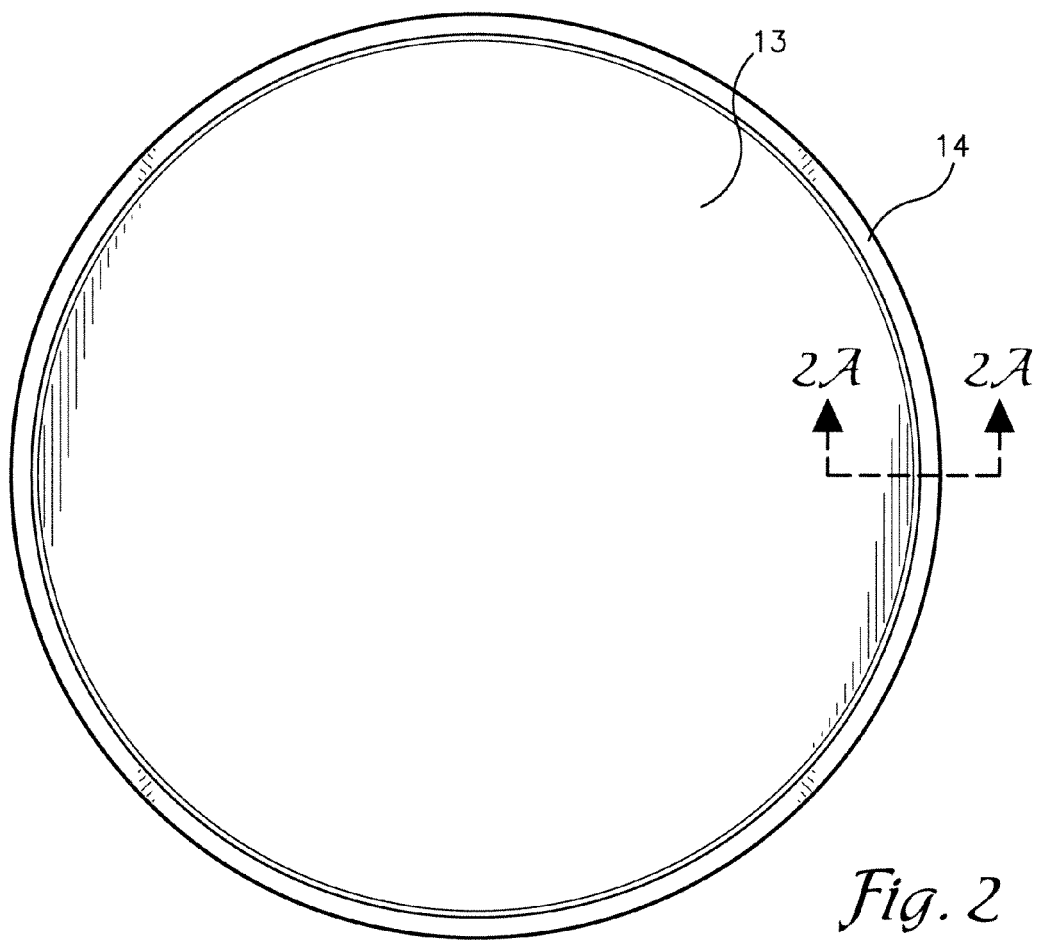
FIG. 2 is a view of an embodiment of a susceptor plate component of the system.
Figure 2A:
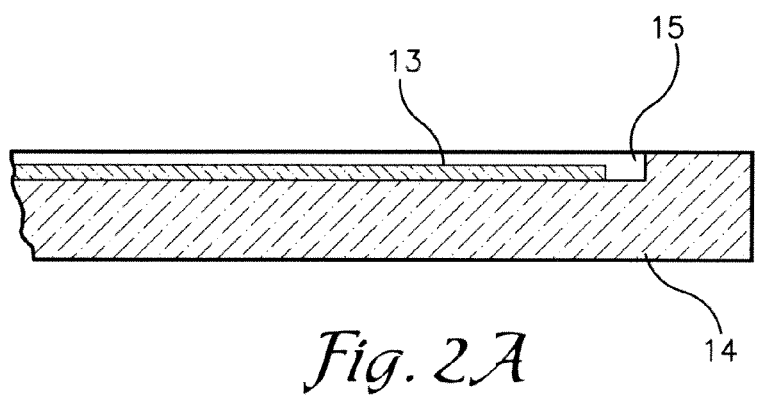
FIG. 2A is a cross-section view of a susceptor plate component of the system.
Figure 3:
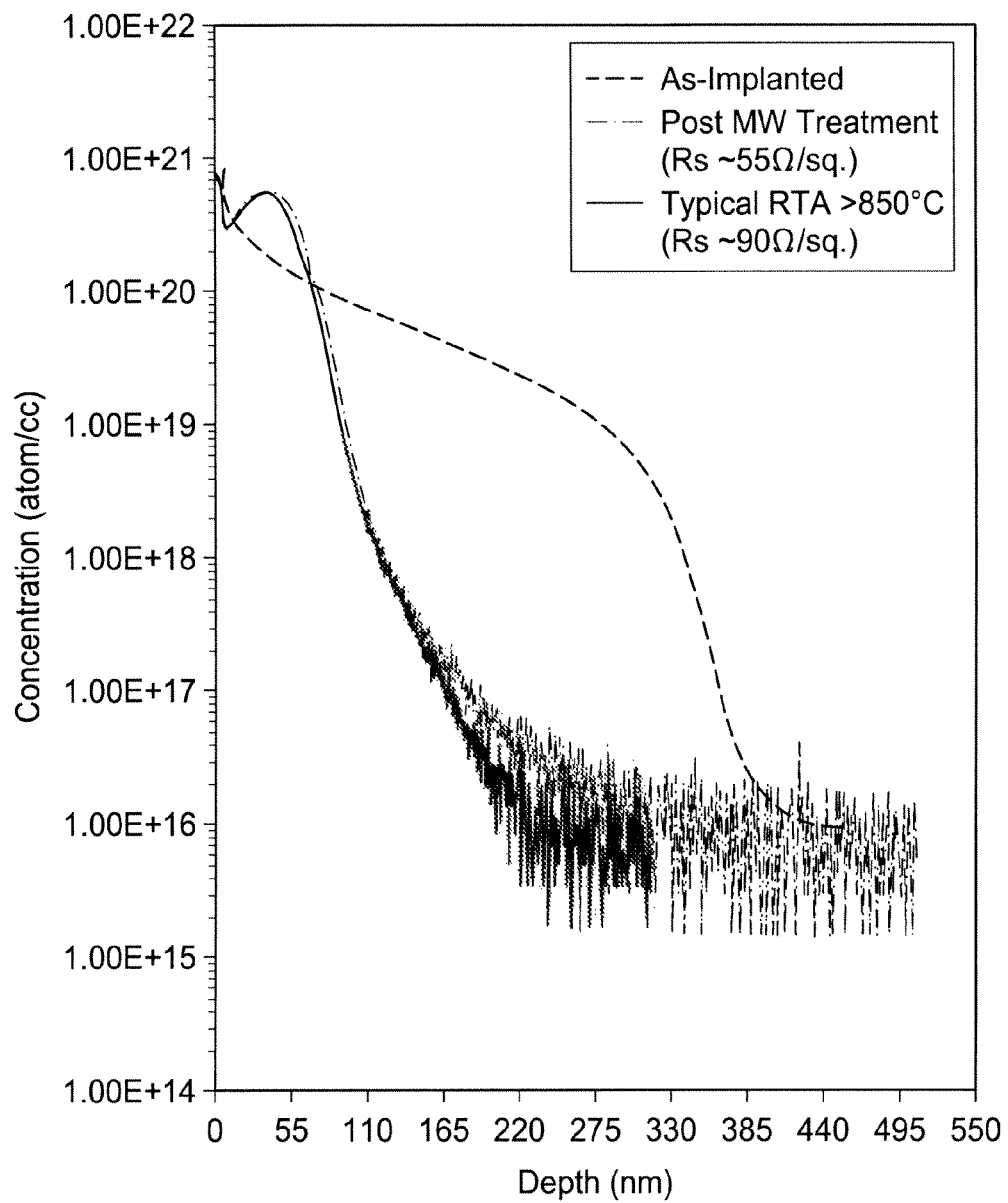
FIG. 3 is a Secondary Ion Mass Spectrometry (SIMS) Profile plot of an implant, pre- and post-microwave treatment, showing the effect of no dopant diffusion of the implanted region, along with a comparison of prior art treatment (RTA)

The present invention accomplishes annealing by tailoring the use of microwave energy to react with the damaged crystalline lattice structure of the semiconductor material and, in so doing, facilitate its repair, i.e., its return to the desired structure and state. Referring to FIGS. 1 and 2, the present invention maintains the semiconductor wafer 11 at a relatively low temperature to uniformly activate the dopant and minimize dopant diffusion, whereas the prior art uses relatively high temperatures which can deactivate the dopant and cause dopant diffusion. At temperatures above 800 degrees C., the thermal radiation energy alone will negate the benefit of volumetric microwave heating. Thus, the present invention maintains the temperature of the wafer approximately below 800 degrees C. during the microwave annealing treatment for a set period of time. Diffusion-free activation can improve the drivability effects and reduce the short-channel effects of the final semiconductor device. Furthermore, the present invention uses controlled ramp rates, and, more generally, continuous power at a controlled microwave power density, whereas the prior art uses pulsed power at relatively high levels, i.e., fast heating and fast cooling, which can induce undesirable results. Additionally, the present invention focuses treatment on highly damaged doped regions of the wafer at relatively low temperatures, whereas high-temperature processing techniques heat the entire processing area and thereby increase the thermal budget of the devices being treated, which causes degradation in the overall yield and performance of the devices. The present invention provides these and other advantages while achieving substantially the same level of activation as other processing techniques.

The penetration depth of the microwave radiation is dependent on the frequency of the radiation and the loss factor of the material being treated. It is difficult to calculate the skin depth for silicon during the annealing process because of changes in conductivity which occurs during heating. This leads to the selection of the frequency use in the microwave sources.

The frequency is controlled to ensure formation of proper mode patterns prevent energy from being reflected back to a magnetron. An acceptable range of frequencies is 900 MHz to 150 GHz. In a preferred embodiment, an acceptable frequency is 5.8 GHz. In each of the above embodiments corresponding to a frequency or range of frequencies, the magnetrons are set at different frequencies and vary by approximately 30 to 50 MHz.

In addition to selecting the appropriate frequency, the dimensions of the chamber are calculated to correspond with the wavelength of the microwave source. This is also known as frequency coupling. When the dimensions of the chamber are a multiple of the wavelength such that only substantially whole wavelengths are present within the chamber, microwave energy is efficiently coupled within the said chamber. In one embodiment based on a frequency of 5.8 GHz, the chamber is a 20 inch×20 inch×20 inch octagon. If the chamber dimensions are changed then the coupling factor (percentage of energy entering the chamber) will change. In such a scenario the process will still work, but more microwave power would be needed. In one embodiment, the chamber is defined as a "multimode" chamber, where the process chamber contains two or more modes.

Another important consideration is to vary the frequency of the magnetrons by approximately 50 MHz. Where ten magnetrons are used, their frequencies would range approximately from 5785 MHz to 5815 MHz, in one embodiment. The center point frequency of each individual magnetron will vary within this range based on the inherent design of the magnetron, this will ensure the frequency is slightly offset (+/−5 MHz) at any one time in comparison to another magnetron. In addition, the frequency is varied by using a slightly unstable DC signal. If the frequency is not varied, resonant waves are formed, resulting in a non-uniform microwave field. Both the dimensions of the chamber and the variance of the frequencies are controlled to achieve a uniform microwave field.

Because silicon has a relatively high thermal conductivity, thermal energy is quickly transferred throughout the thickness of the wafer. The temperature of the wafer, including at its surface, is, therefore, kept below approximately 800 degrees C. to avoid dopant diffusion due to thermal radiation effect. For doped silicon, the resistivity of implanted regions is relatively high before annealing. Direct thermal heating (non-microwave) below approximately 800 degrees C. will not efficiently activate the un-annealed regions and repair localized damage of the implanted wafer. The present invention efficiently couples the microwave energy to the highly doped areas and damaged crystalline lattices and effectively anneals the surface of the wafer through an efficient microwave reaction based on resonance between the microwave frequency, microwave power levels, and the temperature and frequency of the phonons.

All process variables described are specially tailored to each application determined by device manufacture based directly on the activation and damage repair requirements as well as other process requirements of the device that are independent of the implanted region. For example, in one embodiment:

A semiconductor wafer is provided by a client, and the wafer is n-type silicon. The semiconductor wafer contains aluminum metal lines structures on the wafer that are independent of the ion-implanted region; this limits the temperature of the wafer at any time less than approximately 400 degrees C. The wafer is implanted with a Boron implant of energy 10 keV with a dosage of 1 E15 atoms/cm2. This implant forms an amorphous layer (damage) in the silicon and needs to be activated by greater than approximately 80%, and the damage recovered at specifications provided by the client. Based on the temperature limitations, two silicon susceptors (2 mm thick) are chosen and placed above and below the semiconductor wafer at a pitch of 15 mm. The uniform microwave field at a frequency of 5.8 GHz is used. A microwave power of 1700 watts is chosen based on achieving a ramp rate greater than 10 deg C./s. The microwave energy is injected within the multimode chamber and the wafer temperature is measured using an infrared thermometer. The microwave energy is then turned off when the temperature reaches 350 degrees C. which is approximately 100 seconds. The microwave reaction is self limiting; therefore, the microwave reaction of damage recovery and activation occurs within the first 60-70 seconds. The extra time of 30-40 seconds ensures a complete reaction. The process time and microwave power levels are chosen based on the wafer type, the implant, and the limitation of the temperature.

System Components

Referring again to FIG. 1, the system may broadly comprise a chamber 3; an inner process tube 2; an elevator or wafer entrance port 6; a wafer holding rack 11; a temperature sensing device 8; a plurality of microwave energy sources 1; a gas injection method 10; and a susceptor plate(s) 4.

The chamber 3 defines the microwave processing area, and may be constructed of aluminum and/or other suitable material that is microwave reflective (electrically conductive surface). The inner process tube 2 is located within the chamber and further defines the processing area where the ambient conditions 9 are controlled by the gas injected, and may be constructed of fused quartz and/or other suitable material that is microwave transparent. The semiconductor wafer is inserted into the process chamber by the use of an elevator 6 that raises the silicon wafer into or out of the chamber or a wafer port where the wafer is inserted to a fixed wafer holding rack 11. The susceptor plate 4 is either above, below, or both above and below the silicon wafer. The susceptor plate is, in one embodiment, made of silicon, silicon carbide, or fused quartz or any other suitable material.

The temperature sensing device 8 monitors the temperature of the wafer within the chamber and controls the plurality of microwave energy sources 1 to maintain the temperature at or below a desired temperature. The temperature sensing device may include an infra-red pyrometer or other non-contact temperature sensing method.

The plurality of microwave energy sources 1 provide microwave energy to the processing area. As shown, there may be more than one microwave source arranged substantially evenly around the processing area. Each of the microwave sources may include a magnetron, a waveguide, an isolator, and a microwave power measuring device.

For larger wafers, e.g., approximately above 300 mm in diameter, a plurality of sources, i.e., a "multimode" chamber 3 is ideal. A multimode chamber typically suffers from a non-uniform distribution of microwave energy within the processing area due to the formation of modes, i.e., high and low concentration areas of microwave energy. A wafer 11 within this area will experience some spots in which the temperature and frequency are correct and other spots in which they are incorrect, leading to non-uniform activation and potential overheating. One method of creating microwave uniformity within a multimode system is disclosed in U.S. Pat. App. Pub. No. 2007/0167029, Ser. No. 11/559,315, filed Nov. 13, 2006, which is incorporated by reference as though fully set forth herein.

As mentioned, one or more of the microwave sources 1, or radiation generators, may be a magnetron source. This particular source has the advantage of being in mass production, which substantially lowers the cost, complexity, and time required to build the system. One or more of the microwave sources may be a Traveling Wave Tube Amplifier (TWTA), Gyrotron, or Klystron tube source, which may achieve the similar results but at a higher cost.

One or more of the microwave sources 1 may provide microwave energy having a frequency of approximately between 900 MHz and 150 GHz, depending on the requirements of any particular application. For example, in a preferred embodiment, one or more of the microwave sources provides microwave energy at a frequency of approximately 5.8 GHz.

The microwave power directed into the processing area is dissipated through absorption by the walls of the chamber 3 and by the wafer 11. For some applications, the former may be negligible, and it can be assumed that any losses are due primarily to currents induced in the wafer, i.e., Ohmic losses, by incident microwave energy.

The susceptor plates 4 facilitate both achieving a uniform microwave field across the wafer and maintaining the temperature of the wafer uniformly at or below the desired maximum temperature. Fused quartz is a particularly suitable material for the susceptor because it is substantially transparent to, i.e., does not absorb, microwave energy, and therefore most or all of the energy acts on the wafer. This allows for using lower power levels to achieve the required reaction, and lower power levels minimize the risk of undesired arcing and heating. Quartz is also particularly suitable because it has a relatively low thermal conductivity.

Another aspect of the susceptor material in close proximity to the semiconductor wafer may also be used for the present invention for different results in microwave power management at the semiconductor wafer surface. Silicon (or similar material as the semiconductor substrate) will heat by the microwave at the same rate of the target semiconductor wafer. This allows less microwave power density in close proximity of the semiconductor wafer at similar temperatures as compared to a susceptor that is microwave transparent.

The susceptor material, in one embodiment, is silicon carbide. The silicon carbide wafer will absorb more microwave energy and become hotter than the semiconductor wafer. This method can be characterized as hybrid heating, where heat generated by the silicon carbide susceptor directly heats the semiconductor wafer. This allows the least microwave power density at the semiconductor wafer surface. In other embodiments, the susceptor material may be silicon, fused quartz, or any other suitable material depending on the activation and damage repair requirements.

The pitch or spacing distance from the wafer to the susceptor(s) is determined by the requirements of activation and the damage recovery requirements. The pitch is generally, but not limited to, 1 mm to 30 mm or in direct contact, depending on the application. All susceptors are operable in managing the microwave field around the semiconductor wafer within the microwave chamber 3.

Referring to FIG. 2, the edges of a wafer 11 located within a microwave energy field may overheat. This effect can be minimized by incorporating a cut out profile, or recess, into the susceptor 12 for closely receiving the wafer such that the susceptor material closely surrounds and absorbs excess heat from the edges of the wafer.

To further lower the temperature of activation, an adjacent water chill plate may be added below and in contact with the susceptor plate. Again, the annealing process to repair damaged crystalline lattices is dependent on the microwave energy frequency and power levels, not on the temperature; increased temperature is a byproduct of microwave heating due to Ohmic losses. Using a chill plate to remove heat can be particularly useful for applications involving substrate materials with relatively low melting points, such as SiGe.

The present invention can be adapted to accommodate single wafer processing or multiple wafer, i.e., batch, processing. The process of the present invention is compatible with applications using additives such as boron, arsenic, and phosphorous, as well as mixtures, such as BF2, for activation. Certain applications may require single wafer processing. More specifically, batch processing may require significantly more power to maintain the W/cm2 required for activation across the surface of the wafers, and multiple microwave power sources may be used. Nevertheless, batch processing allows for increased wafer throughput and can thereby lower the processing cost per wafer.

Although the invention has been disclosed with reference to one or more particular embodiments, it is understood that equivalents may be employed by those skilled in the art and substitutions made herein without departing from the contemplated scope of the invention.

TABLE OF ELEMENTS COMPRISING DRAWING FIG. 1

1. Microwave Source
2. Fused quartz Tube Crucible: Use to maintain clean environment and allow vacuum processing
3. Multimode Microwave Chamber Enclosure
4. Susceptor Plate
5. Access Door: Can be from bottom, top, or side access
6. Load Elevator: one example of inserting and removing semiconductor wafer from chamber
7. General Support Frame
8. Infrared pyrometer: non contact temperature measurement
9. Controlled Ambient
10. Gas Injection: To control Ambient
11. Wafer Support Rack: Hold susceptors and semiconductor wafer.
12. Water chill plate

TABLE OF ELEMENTS COMPRISING DRAWING FIG. 2

13. Semiconductor Wafer
14. Susceptor Disc
15. Cut Out Profile

What is claimed is:

1. A method of annealing treatment of a semiconductor wafer comprising the steps of:
    a. introducing the semiconductor wafer within a microwave chamber;
    b. supporting at least one semiconductor wafer with a wafer rack in close proximity to at least one susceptor;
    c. applying controlled microwave radiation at a frequency to the microwave chamber from at least one source; and
    d. controlling the frequency within a range of approximately 900 MHZ to approximately 150 GHz,
    wherein applying controlled microwave radiation comprises generating microwave radiation from multiple sources having an operable variance of frequency, and the operable variance of the frequencies is approximately 50 MHZ.

2. A method of annealing treatment of a semiconductor wafer comprising the steps of:
    a. introducing the semiconductor wafer within a microwave chamber having dimensions substantially equal to a multiple of the wavelength of the microwave radiation;
    b. supporting at least one semiconductor wafer with a wafer rack in close proximity to at least one susceptor;
    c. applying controlled microwave radiation at a frequency to the microwave chamber from at least one source; and
    d. controlling the frequency within a range of approximately 900 MHZ to approximately 150 GHz.

3. A method of annealing treatment of a semiconductor wafer comprising the steps of:
    a. introducing the semiconductor wafer within a microwave chamber;
    b. supporting at least one semiconductor wafer with a wafer rack in close proximity to at least one susceptor;
    c. applying controlled microwave radiation at a frequency to the microwave chamber from at least one source; and
    d. controlling the frequency within a range of approximately 900 MHZ to approximately 150 GHz,
    wherein a slightly unstable DC signal is used to vary the frequency of the microwave radiation within 50 MHZ.

4. A method of using a susceptor in close proximity to a semiconductor wafer at a relatively low temperature, a relatively low power level microwave energy, and a relatively long exposure time to repair damage to a crystalline structure of the semiconductor wafer that occurs during an ion-implantation of impurities into the wafer, comprising:
    controlling the temperature at approximately below 750 degrees C.; maintaining the power level at approximately below 10 W/cm2, exposing the wafer for approximately at least 1 second, and controlling the frequency of the microwave radiation from multiple sources within a range of approximately 900 MHZ to approximately 150 GHz with an operable variance of frequencies between the multiple sources.

5. A method according to claim 4 in which the microwave radiation is in the frequency range of approximately 900 MHZ to approximately 100 GHz.

6. A method according to claim 4 in which the microwave radiation is in the frequency of approximately 5.8 GHz.

7. A method according to claim 4 in which the operable variance of the frequency is approximately 50 MHZ.

8. A method according to claim 4 where a frequency coupling is achieved by utilizing a multimode microwave chamber with dimensions substantially equal to a multiple of the wavelength of the microwave radiation.

9. A method according to claim 4 where multiple magnetrons are used to vary the frequency of the microwave radiation.

10. A method according to claim 4 where a slightly unstable DC signal is used to vary the frequency of the microwave radiation within 50 MHZ.

11. A method for treatment of a semiconductor utilizing microwave radiation, the method comprising:
    introducing the semiconductor into a microwave chamber;
    positioning the semiconductor relative to a susceptor to control treatment of the semiconductor;
    heating the semiconductor a first time to a low treatment temperature of approximately between 100 degrees C. and 800 degrees C.;

heating the semiconductor a second time to a high treatment temperature above approximately 800 degrees C.; and controlling the frequency of the microwave radiation within a range of approximately 900 MHZ to approximately 150 GHz, wherein the semiconductor is annealed with multiple radiation generators having an operable variance between frequencies of approximately 50 MHZ.

12. A method for treatment of a semiconductor utilizing microwave radiation, the method comprising:

introducing the semiconductor into a microwave chamber;

positioning the semiconductor relative to a susceptor to control treatment of the semiconductor;

heating the semiconductor a first time to a low treatment temperature of approximately between 100 degrees C. and 800 degrees C.;

heating the semiconductor a second time to a high treatment temperature above approximately 800 degrees C.; and controlling the frequency of the microwave radiation within a range of approximately 900 MHZ to approximately 150 GHz, wherein a frequency coupling is achieved by utilizing a microwave chamber with dimensions substantially equal to a multiple of the wavelength of the microwave radiation.

13. A method for treatment of a semiconductor utilizing microwave radiation, the method comprising:

introducing the semiconductor into a microwave chamber;

positioning the semiconductor relative to a susceptor to control treatment of the semiconductor;

heating the semiconductor a first time to a low treatment temperature of approximately between 100 degrees C. and 800 degrees C.;

heating the semiconductor a second time to a high treatment temperature above approximately 800 degrees C.; and controlling the frequency of the microwave radiation within a range of approximately 900 MHZ to approximately 150 GHz, wherein a slightly unstable DC signal is used to vary the frequency of the microwave radiation.

* * * * *